(12) United States Patent
Flores et al.

(10) Patent No.: US 9,698,143 B2
(45) Date of Patent: Jul. 4, 2017

(54) WIRELESS MODULE WITH ACTIVE DEVICES

(71) Applicant: Fairchild Semiconductor Corporation, San Jose, CA (US)

(72) Inventors: Allan Tungul Flores, Caloocan (PH); Romel N. Manatad, Cebu (PH)

(73) Assignee: Fairchild Semiconductor Corporation, San Jose, CA (US)

(*) Notice: Subject to any disclaimer, the term of this patent is extended or adjusted under 35 U.S.C. 154(b) by 503 days.

(21) Appl. No.: 14/020,775

(22) Filed: Sep. 6, 2013

(65) Prior Publication Data

US 2014/0071650 A1 Mar. 13, 2014

Related U.S. Application Data

(60) Provisional application No. 61/697,893, filed on Sep. 7, 2012.

(51) Int. Cl.
*H01L 27/088* (2006.01)
*H01L 21/56* (2006.01)
(Continued)

(52) U.S. Cl.
CPC .......... *H01L 27/088* (2013.01); *H01L 21/56* (2013.01); *H01L 23/49524* (2013.01); *H01L 23/49541* (2013.01); *H01L 23/49562* (2013.01); *H01L 23/49575* (2013.01); *H01L 23/49589* (2013.01); *H01L 23/52* (2013.01); *H01L 24/36* (2013.01);
(Continued)

(58) Field of Classification Search
CPC . H01L 23/49; H01L 23/49575; H01L 27/088; H01L 21/56; H01L 23/49524; H01L 23/49541; H01L 23/49562; H01L 23/49589; H01L 23/52; H01L 24/36; H01L 24/37; H01L 24/40; H01L 23/3107;
(Continued)

(56) References Cited

U.S. PATENT DOCUMENTS 7,745,892 B1 * 6/2010 Ivanov ................ B81C 1/00246
257/414
7,787,299 B2 8/2010 Won
(Continued)

FOREIGN PATENT DOCUMENTS

EP 2 482 312 A2 8/2012
KR 10-2012-0089543 A 8/2012

OTHER PUBLICATIONS

International Search Report and Written Opinion mailed Dec. 27, 2013, issued in corresponding International Application No. PCT/US2013/058770, filed Sep. 9, 2013, 14 pages.

*Primary Examiner* — Eric Thomas
*Assistant Examiner* — Michael P McFadden
(74) *Attorney, Agent, or Firm* — Brake Hughes Bellermann LLP

(57) ABSTRACT

In a general aspect, a wireless multichip module can include a leadframe structure with portions configured to receive at least one flip-chip mounted semiconductor die, including one or more of an integrated circuit, a high side MOSFET and/or a low side MOSFET, which can form a half-bridge circuit that is encapsulated in a molding compound. The module can be assembled without any bond wires (e.g., be wireless). The module may include carry passive components including an external input capacitor and/or an internal input capacitor.

20 Claims, 12 Drawing Sheets

(51) Int. Cl.
*H01L 23/52* (2006.01)
*H01L 23/49* (2006.01)
*H01L 23/495* (2006.01)
*H01L 23/00* (2006.01)
*H01L 23/31* (2006.01)

(52) U.S. Cl.
CPC .............. *H01L 24/37* (2013.01); *H01L 24/40* (2013.01); *H01L 23/3107* (2013.01); *H01L 2224/16245* (2013.01); *H01L 2224/37147* (2013.01); *H01L 2224/40245* (2013.01); *H01L 2224/73255* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/19105* (2013.01)

(58) Field of Classification Search
CPC . H01L 2224/16245; H01L 2224/37147; H01L 2224/40245; H01L 2224/73255

USPC ......................................................... 361/772
See application file for complete search history.

(56) References Cited

U.S. PATENT DOCUMENTS

| | | | |
|---|---|---|---|
| 8,148,823 B1* | 4/2012 | Vinciarelli | H01L 23/49822 257/700 |
| 2009/0091010 A1* | 4/2009 | Calo | H01L 23/4952 257/675 |
| 2009/0230518 A1* | 9/2009 | Liu | H01L 23/49524 257/666 |
| 2009/0267171 A1* | 10/2009 | Yean | H01L 23/13 257/434 |
| 2009/0283919 A1 | 11/2009 | Tsui | |
| 2011/0163391 A1* | 7/2011 | Kinzer | H01L 21/76898 257/401 |
| 2012/0119343 A1 | 5/2012 | Bayan | |
| 2012/0149149 A1* | 6/2012 | Liu | H01L 23/49524 438/107 |
| 2012/0168926 A1 | 7/2012 | Cho | |

* cited by examiner

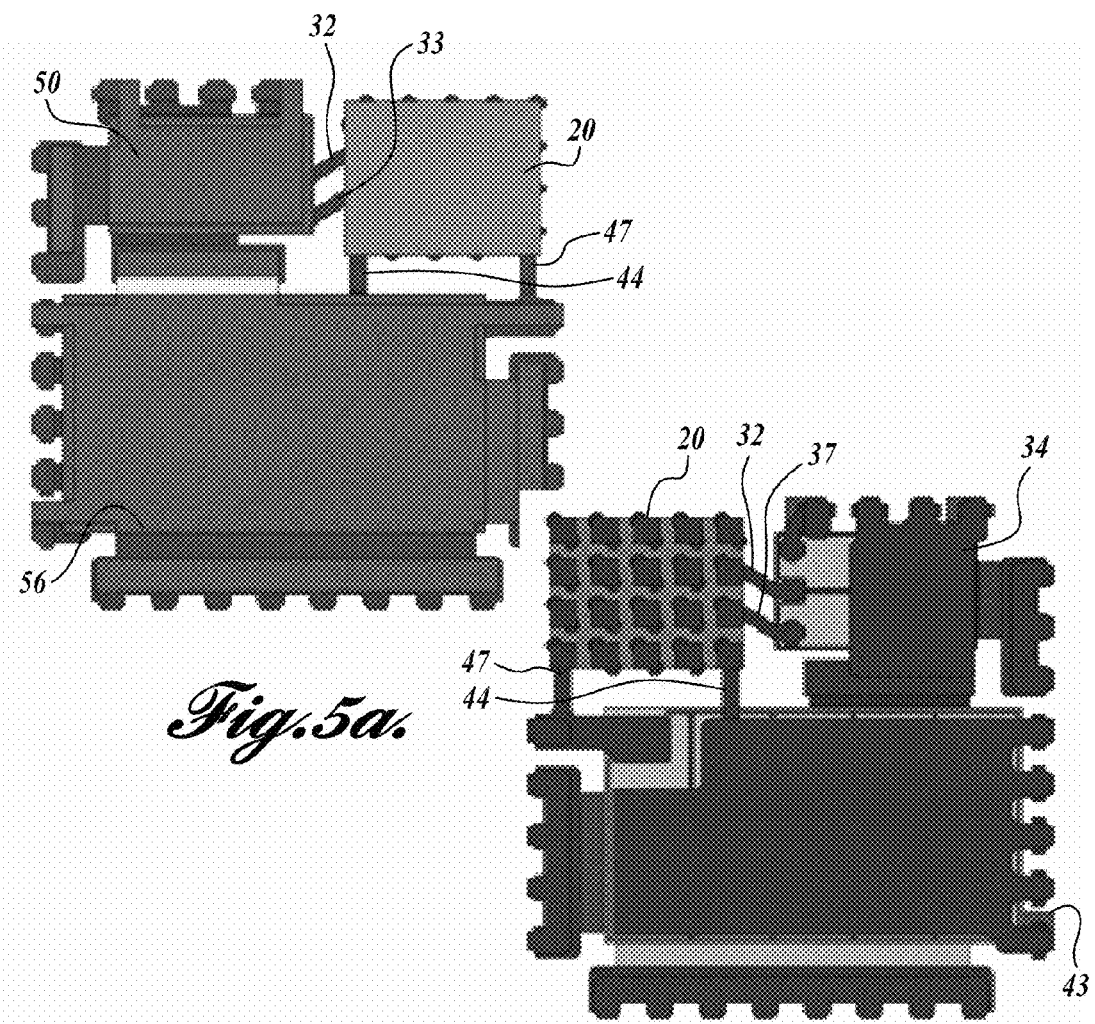

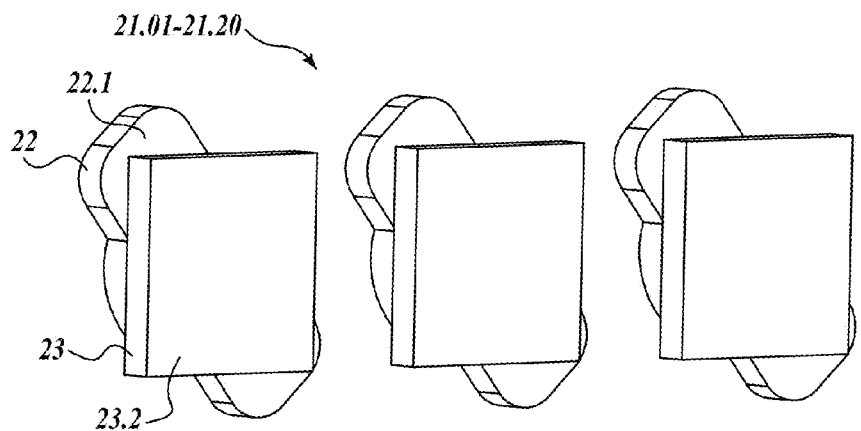
Fig. 7a1.
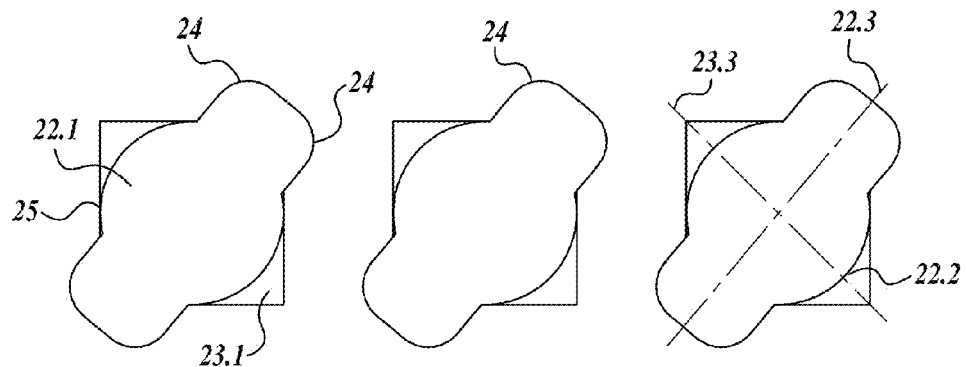
Fig. 7a2.
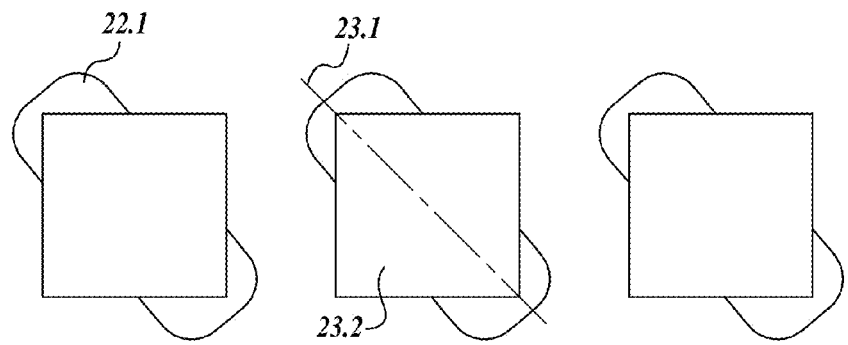
Fig. 7a3.

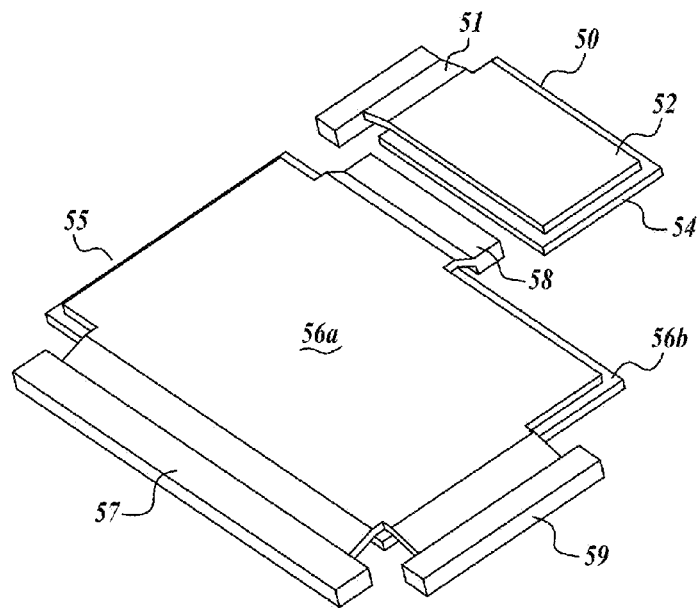
Fig.7b1.
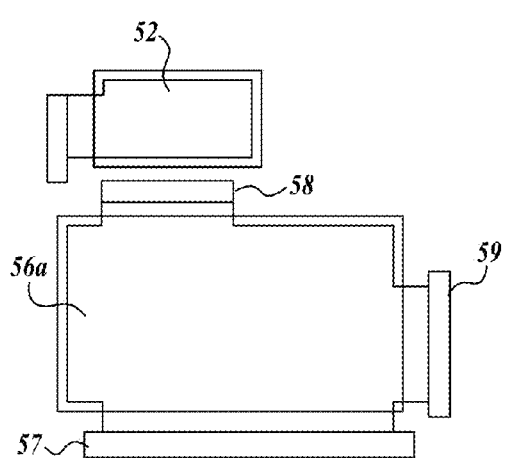 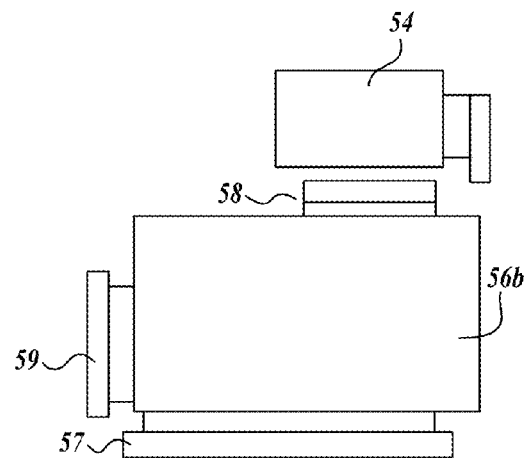
Fig.7b2.    Fig.7b3.

WIRELESS MODULE WITH ACTIVE DEVICES

CROSS-REFERENCE TO RELATED APPLICATION

This application claims the benefit of Provisional Application No. 61/697,893, filed Sep. 7, 2012, the entire disclosure of which is hereby expressly incorporated by reference in its entirety. This application shares one or more inventors, and portions of the specification are also found in U.S. application Ser. No. 14/020,782, filed Sep. 6, 2013, now abandoned.

BACKGROUND

The invention is generally related to providing multiple semiconductors in a common package, and, in particular to multi-chip modules (MCM) that includes an integrated circuit (IC) and one or more power devices, especially a half-bridge circuit with a driver IC and high side and low side power mosfets.

In U.S. Pat. No. 7,915,721, a MCM is shown with an IC and two power mosfets packaged as a module. The IC is formed on a die of semiconductor material which is attached to a central die pad of a leadframe. Very thin wire bonds connect the bond pads of the IC to external and internal leads or to the power mosfets. The mosfets are flip chip attached to leadframes and have clips that selectively connect terminals of the mosfets to the IC and to internal and external leads.

The above reference demonstrates the two types of assembly techniques common in the semiconductor industry: wire bonding and flip chip attachment. Wire bonding generally requires larger package sizes since the wire bonds need room to loop wire from the bond pads on the IC to the leads of the leadframe. As the IC becomes more complex, it tends to have more bond pads for input, output and internal connections to other devices.

Although the technology of wire bonding has overcome many obstacles, nevertheless wire bonding has a number of disadvantages and drawbacks. The designer must leave physical space in the package to allow room for the bonding equipment to attach one of each wire to a bond pad, loop the wire, and attach the other end of the wire to the leads. In many cases the external leads are distributed around the periphery of the package, thereby requiring a package outline that is substantially greater than the size of the IC die. Even with all the improvements in wire bonding, there are still risks of displacement in X, Y and Z axis during assembly. Stacked devices with wire bonds are prone to misalignment. The wire bonds themselves are subject to a number of potential failures including ball/wedge bond lifting, shorting, wire breaking, voids in bonds and contaminants. Each wire bond may fail at any one of three points: the bond pad, the lead and along the length of the wire and any one failure will result in the loss of the entire die even if the die passed its electrical tests.

Other assembly techniques provide packages that have very small profiles. With flip chip assembly, balls, pillars or bumps are deposited on the contact terminals of chips. The balls, pillars, or bumps are attached to pads or leads in a single operation where the balls, pillars or bumps are soldered to the leads. Where a single mosfet or multiple mosfets are all flip chip assembled and encapsulated with an insulating resin, the resulting package may be relatively small, approaching the actual scale of the chips themselves. Since power mosfets have only three terminals (source, gate and drain) it is relatively simple to flip chip assemble mosfet and make a chip scale package. However, when a MCM includes an IC, the multiple wire bonds required to assemble the IC will result in a relatively large size package in order to accommodate the wire bonded IC, such as the one shown in U.S. Pat. No. 7,915,721.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The following embodiments of the invention show complete wireless solutions for mounting two or more semiconductor devices and an integrated circuit in one molded module. The embodiments of the invention eliminate the need for bond wires to connect devices to each other or to the integrated circuit. The devices and integrated circuit are interconnected by one or more interconnect structures including leadframe structures such as attach pads, traces, clips, downsets and terminals. These wireless connections provide robust metal conductors to interconnect devices and integrated circuits in lieu of conventional slender, fragile bond wires. The interconnect structures provided by attach pads, traces, clips, downset and terminals have low inductance compared to comparable bond wire interconnects. The molded module also has a smaller thickness compared to modules made with wire bonds because the loop height clearance required by wire bonds is not needed for the interconnect structures of the invention. The invention allows all devices and integrated circuits to be flip-chip mounted. Molding material is locked to the interconnect structures by half or double etching the interconnect structures to provide stepped profiles which hold the interconnect structures in place in the molding material.

In one embodiment the integrated circuit may be premolded in insulating material for later encapsulation with the semiconductor devices. In another embodiment the integrated circuit is molded at the same time as the rest of the components. In other embodiments the semiconductor devices are high side and low side mosfets which are connected to the integrated circuit to provide a half-bridge circuit module. The mosfets may be mounted in standard fashion with suitable modifications made to the clips, downsets and leads. Other embodiments include one mosfet flip-chip mounted and the other mosfet regularly mounted.

In still other embodiments, passive components are mounted on the leadframe structures of the invention. In some embodiments at least one device is external the molding material and in other embodiments all the passive components are within the molded material.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 5a is a top view of one embodiment of the invention with all flipped dies.

FIG. 5b is a bottom view of the embodiment of the invention in FIG. 5a.

FIG. 6b is a plan view of the assembly shown in FIG. 6a.

FIGS. 7a1, 7a2, and 7a3 are, respectively, isometric, top and bottom views of the half-etched terminals for the IC.

FIGS. 7b1, 7b2, and 7b3 are, respectively, isometric, top and bottom views of conductive clips with downsets.

FIG. 8b is a plan view of the top of the leadframe of FIG. 8a.

FIG. 8c is a plan view of the bottom of the leadframe of FIG. 8a.

DETAILED DESCRIPTION

This application incorporates by reference the entire contents of U.S. Pat. Nos. 7,975,721 and 7,371,616. Those skilled in the art understand that the modules described herein may be used to fabricate half-bridge circuits and the modules of this patent may be configured in the schematic arrangements shown in the patents incorporated reference by suitable modifications of the connection made among the devices of the module.

The term "leadframe structure" can refer to a structure that is derived from or is the same as a leadframe. Each leadframe structure can include two or more leads with lead surfaces and a die attach region. The leads extend laterally from the die attach region. A single lead frame structure may include a gate lead structure, and a source lead structure.

The leadframe structure may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.5 mm).

The leadframe structure can be stamped, etched and/or patterned using conventional processes to shape the leads or other portions of the leadframe structure. For example, the leadframe structure can be formed by stamping, or by etching a continuous conductive sheet to form a predetermined pattern. If by etching, before or after etching the leadframe structure can also be optionally stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframes structures. As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure. In addition, some of the leadframe structures are double half-etched to still further improve the lock between molding compound and the leads.

Figure 1:
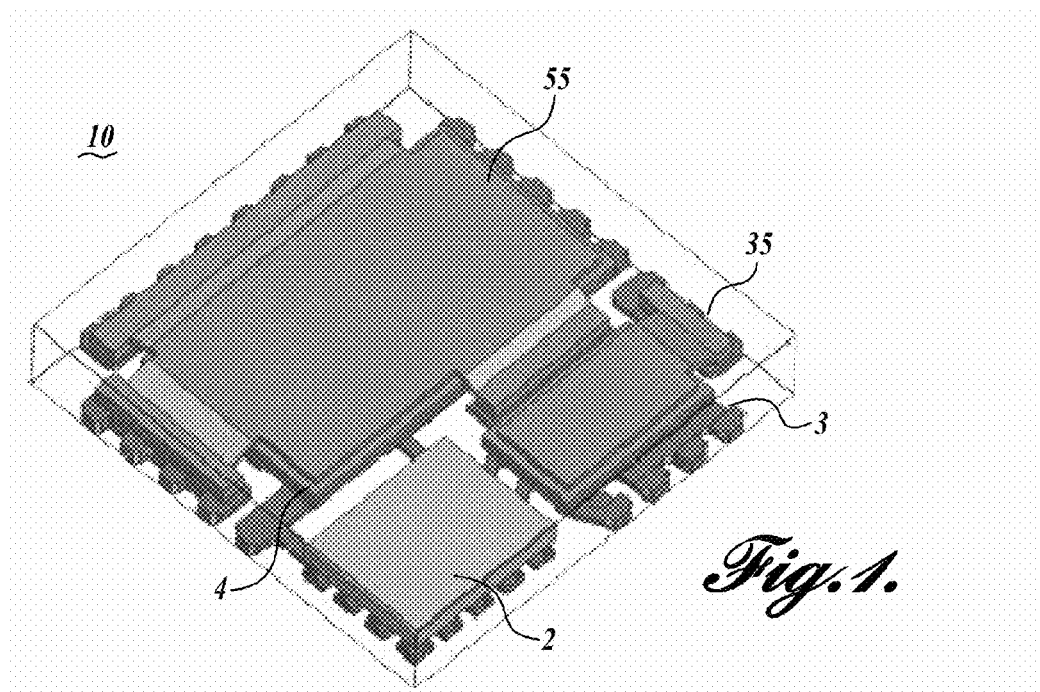
FIG. 1 is a top isometric view of one embodiment of the MCM.
Figure 2:
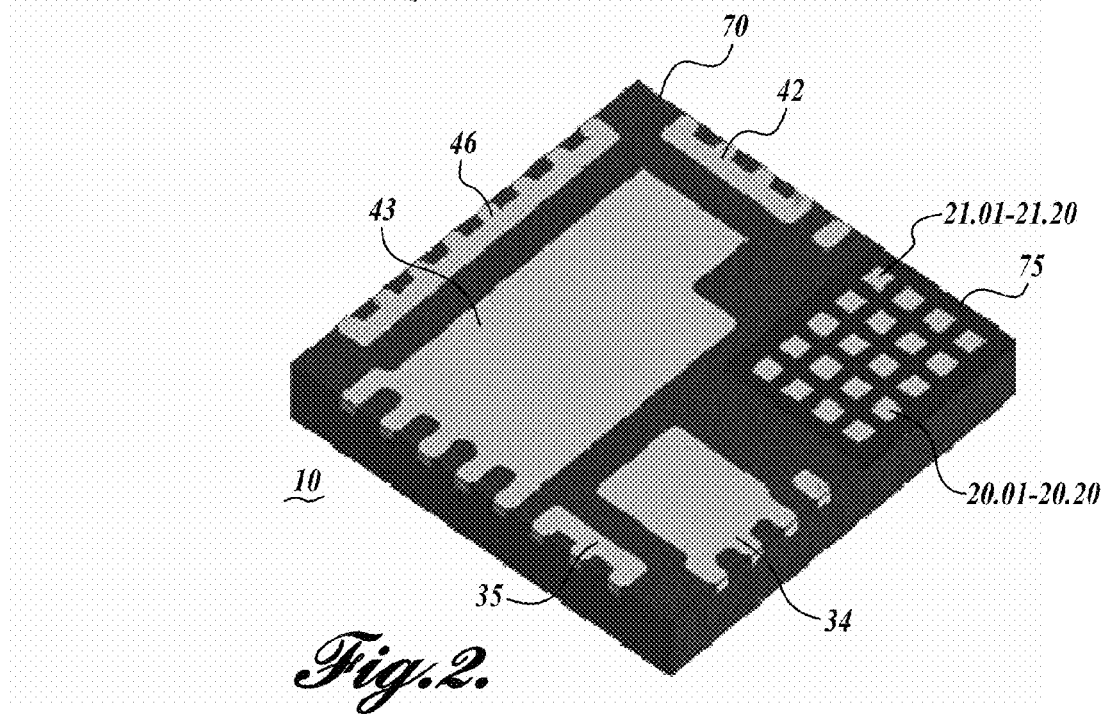
FIG. 2 is a bottom isometric view of the embodiment of FIG. 1.
Figure 3:
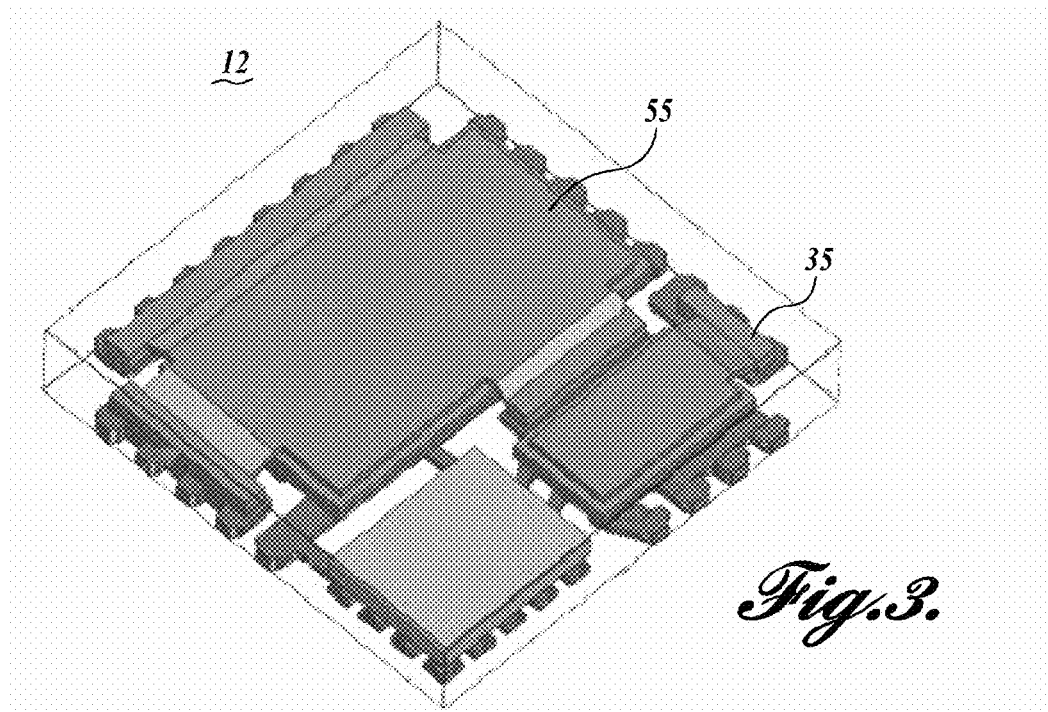
FIG. 3 is a top isometric view of another embodiment of the MCM.
Figure 4:
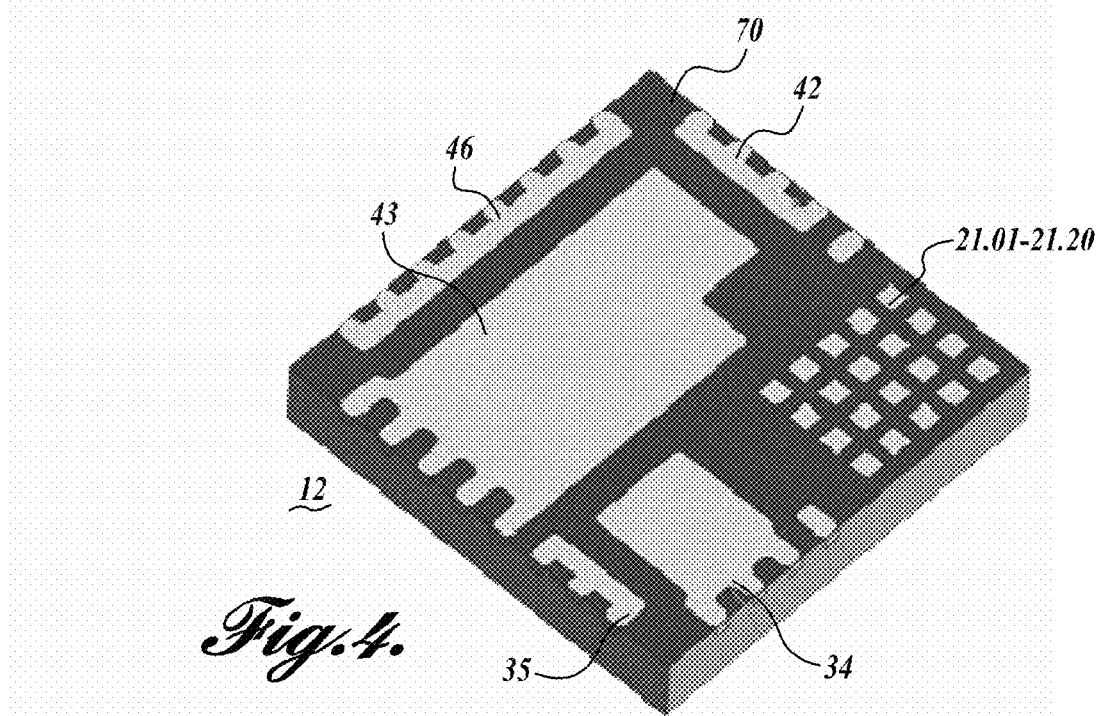
FIG. 4 is a bottom isometric view of the embodiment of FIG. 2.

The embodiment of FIGS. 1 and 2 is a wireless module 10 which has an integrated circuit 2, a high side mosfet 3, and a low side mosfet 4. The input/output terminals 21.01-21.20 and the terminals for an integrated circuit 2 are flip-chip attached to a leadframe structure 11 that includes IC and mosfet portions 20, 30, 40. The mosfets are embedded in molding compound 70 and the integrated circuit 2 has its terminals 21.01-21.20 embedded in a non-conductive material 75, such as polyimide or another molding compound. In an alternate embodiment, wireless module 14 as shown in FIGS. 3 and 4 has its mosfets 3, 4 and integrated circuit 2 are flip chip attached to a leadframe structure 11 and all terminals for high side mosfet 3, low side mosfet 4 and for the integrated circuit 2 are embedded in second layer of molding compound 70 or other non-conductive material 75. In both embodiments, a leadframe structure 11 has component frames 20, 30, and 40 for the integrated circuit 2, the high side mosfet 3, and the low side mosfet 4, respectively. The difference between module 10 and module 12 is that the module 10 embeds the terminals 21.01-21.20 of the integrated circuit 2 in non-conductive material 75 including and not limited to polyimide and the module 12 embeds all terminals of module 12 in second layer molding compound or other non-conductive material.

In FIGS. 1 and 2 the module 10 has individual leadframe portions 20, 30, 40 (See FIG. 8a) for the integrated circuit 2, the high side mosfet 3, and the low side mosfet 4, respectively, where all devices are flip chip attached. The leadframe portion 20 for the integrated circuit 2 includes an array of terminals 21.01-21.20. The terminals 21.1-21.20 have their top and bottom surfaces half-etched. The half-etched surfaces of the terminals provide edge, top and bottom surfaces on the terminals 21.1-21.20 that interlock with non-conductive material 75 in the embodiment of FIGS. 1 and 2. In embodiment 12 shown in FIGS. 3 and 4, the integrated circuit 2 is flip chip attached to terminals 21.01-21.20 that are embedded in molding compound 70.

In the first embodiment, module 10 has that both mosfets flip-chip mounted. In other words, their sources and gates face down and their drains face up. As will be explained hereinafter, clips 50, 55 with downsets connect the source of the high side mosfet 3 to the drain of the low side mosfet 4. The leadframe portion 30 for the high side mosfet 3 includes a high side source lead trace 32 extending from the high side source leadframe structure toward a high side source terminal 21.11 of the integrated circuit. A high side gate lead trace 33 extends from the high side leadframe portion 30 to a high side gate terminal 21.6 of the integrated circuit. See FIGS. 5a, 5b. The high side leadframe portion has a drain lead post 35 disposed along an edge of the high side leadframe structure for receiving a downset from clip 50.

The leadframe portion 40 for the low side mosfet includes a source trace 44 extending from the low side source leadframe portion toward a low side source terminal 21.16 of the integrated circuit 20. A low side gate lead trace 47 extends from the low side leadframe portion 40 to a low side gate terminal 21.20 of the integrated circuit 20. Lead posts 42, 46 and leads 41.1-41.5 disposed along edges of the low side leadframe structure receive downset bars of drain clip 55.

Figure 6A:
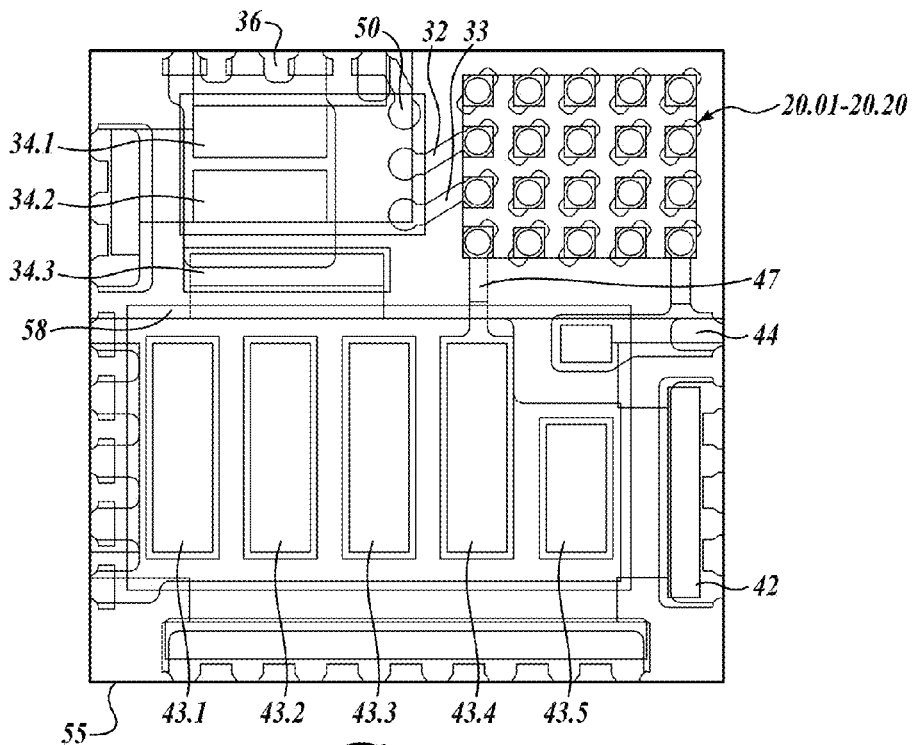
FIG. 6a is an outline views of a wireless assembly of integrated circuit and mosfet dies assembled on a leadframe.
Figure 6B:
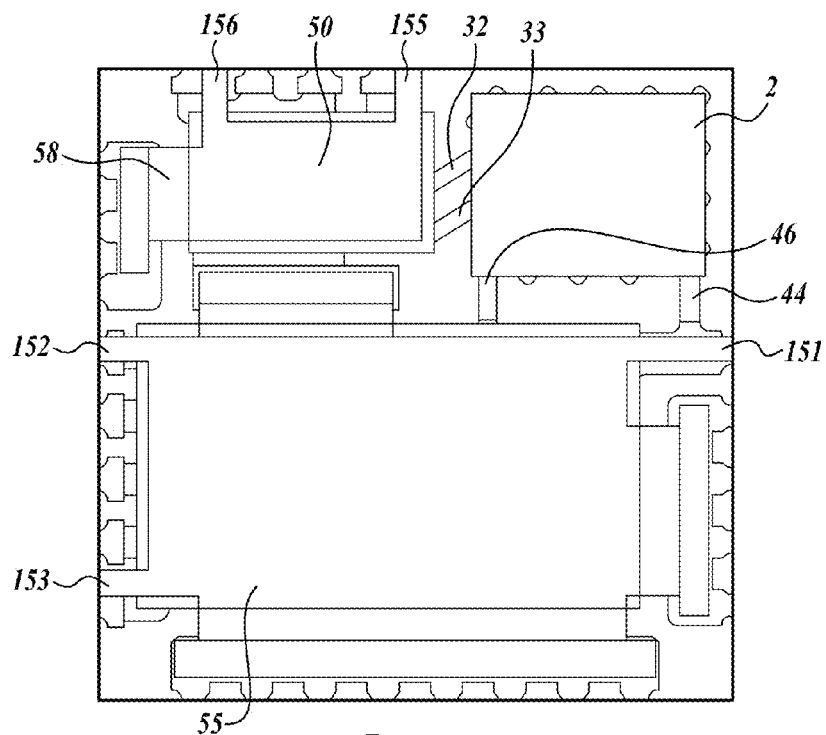

FIGS. 5a, 5b show the top and bottom view, respectively, of the assembly of the leadframe 10 and dies 2, 3, 4 for the module 10 or 12. FIG. 6a shows details of the interconnection of clips, traces and terminals for the assembly of FIGS. 5a, 5b. The clip 50 covers the high side die 3. Trace 32 connects the gate of the high side die 3 to one of the terminals 20.10-20.20 of the IC 2 and trace 33 connects the source of the high side mosfet 3 to another terminal of IC 2. Trace 44 connects the gate of the low side mosfet 4 to one of the terminals 20.10-20.20 of the IC 2 and trace 47 connects the source of the low side mosfet 4 to another terminal of IC 2. Downset 58 connects the clip 55 on the drain of the low side mosfet to source pad 34.1 of the high side mosfet source pad 34.

FIGS. 7a1, 7a2 and 7a3 show details of the structure for the input/output terminals 21.01-21.20 of the integrated circuit. Each terminal is fashioned from leadframe structure material to have terminals 20 with differently shaped upper and lower elements 22, 23, respectively. The top surface 22.1 of upper element 22 has a quasi-rectangular shape with rounded corners 24 and central arcs 25 on opposite sides of axis 22.3. The element 22 is symmetrical about the axis 22.3. The bottom element 23 has four sides and may be rhombic, rectangular or square in shape. The axis 22.3 of the element 22 is aligned with the diagonal axis 23.3 of the bottom element 23. The different half-etched shapes on top and bottom of the terminals provide interlocking connections among the terminals and the non-conductive material 75 or molding compound. More specifically, the terminals 20 are formed from a sheet of conductive material. The shape of element 22 is formed by one etch step and the shape of element 23 is performed by a second etch step on the same sheet of material. As such, the terminals 22 are double etched to provide multiple steps for their contours.

FIGS. 7b1, 7b2 and 7b3 show details of the conductive clips 50, 55. One clip 50 connects the high side mosfet 3 to a power supply. It has a planar portion 52 that is raised with respect to a larger lower planar portion 54. The raised planar portion contributes to locking the clip in the molding compound 70 and is formed by half-etching a flat sheet of conductive material. For example, the desired raised area is covered with a patterned resist and the rest of the sheet is etched to form the raised pad 50 and the downset 51. The downset is bent into position. The lower surface of the lower planar portion is soldered or otherwise fixed to the source of the high side mosfet 3. A downset 51 terminates in leads for connection to a supply voltage.

The other clip 55 interconnects the two mosfets 3, 4 and provides an output terminal for the half bridge circuit. It is formed in a similar manner as described above for clip 50. Clip 55 has a planar portion 56a is raised with respect to a larger lower portion planar portion 56b. The raised planar portion 56a contributes to locking the clip in the molding compound 70. The lower surface of the lower planar portion 56b is soldered or otherwise fixed to the source of the low side mosfet 4. Clip 54 has one downset 58 that interconnects source of the high side mosfet 3 to the drain of the low side mosfet 3 and carries that connection to external drain terminals 59. Other downsets 57, 59 have terminals that are exposed by the molding compound 70 to provide connections for the output of the half bridge circuit.

Figure 8A:
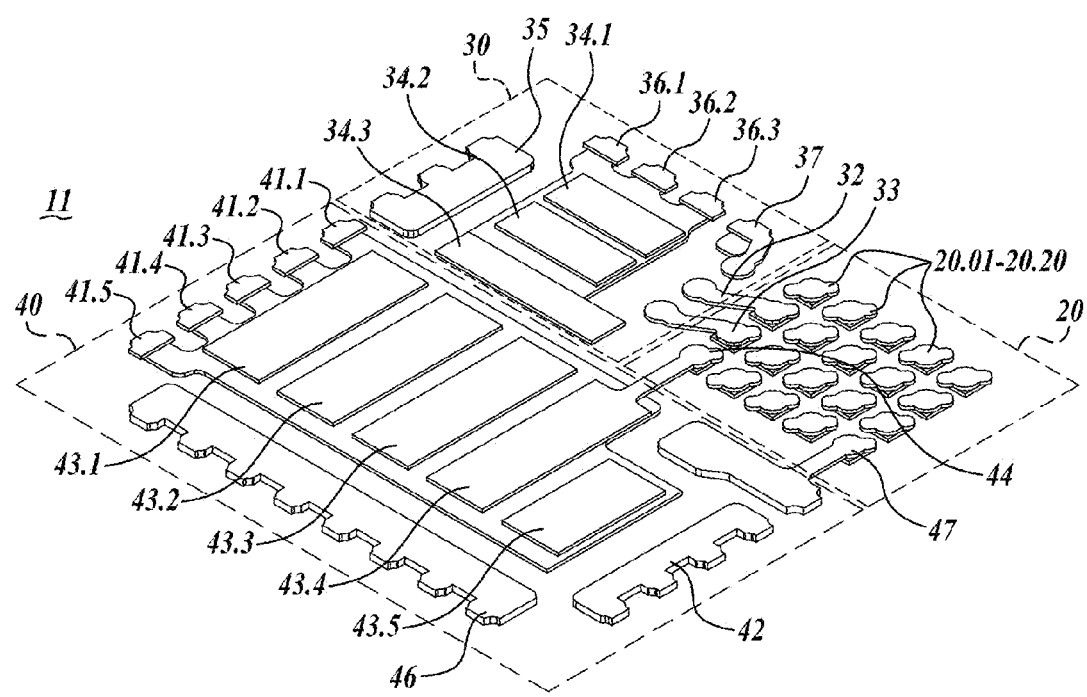
FIG. 8a is an isometric view of an embodiment of a leadframe.
Figure 8B:
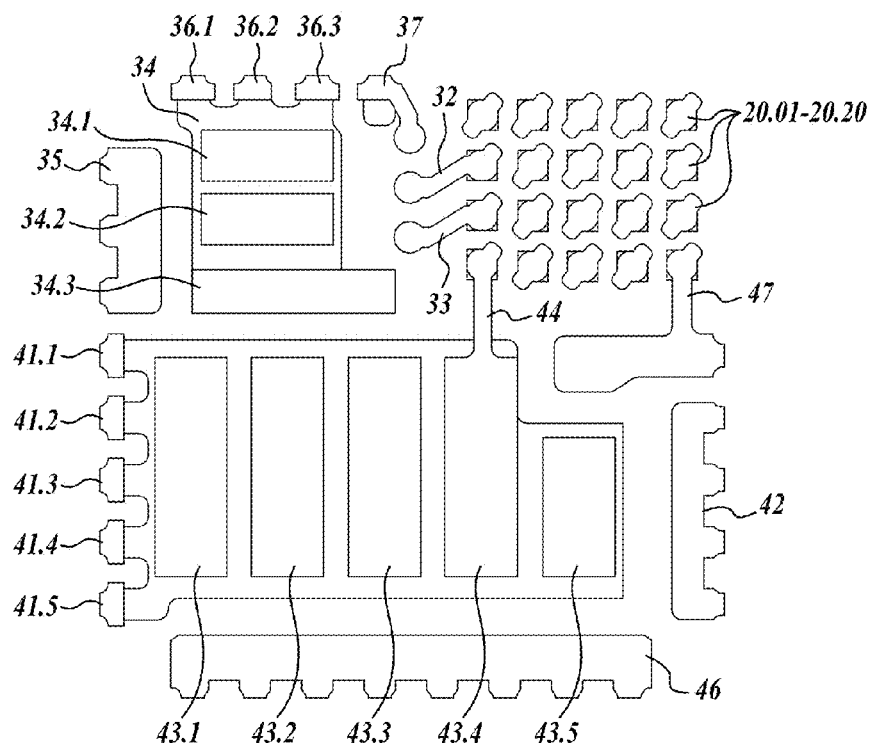
Figure 8C:
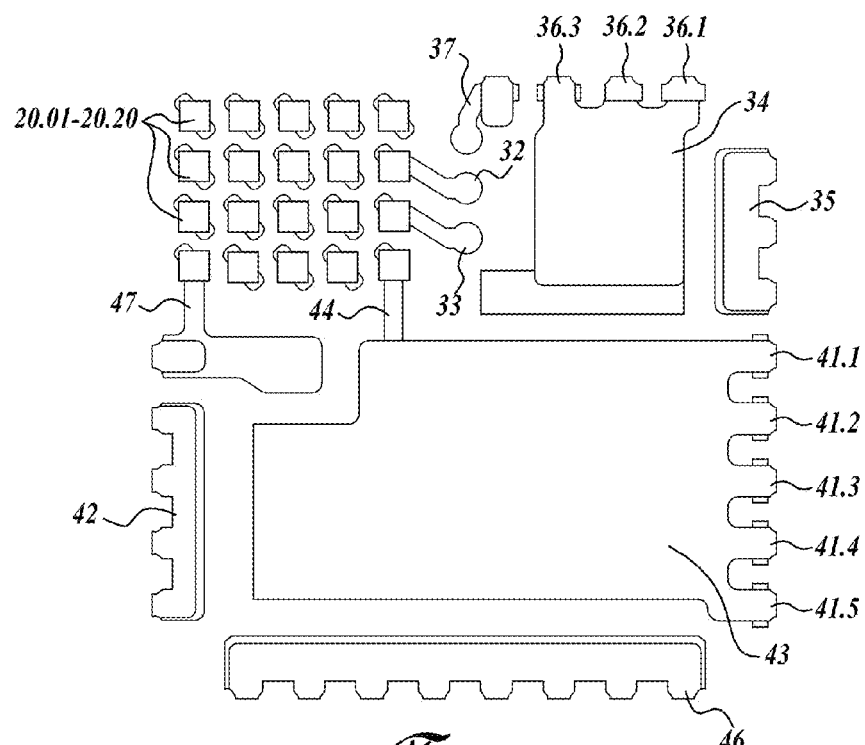

Turning to FIGS. 8a-8c, they show features of the half-etched leadframe structure 11. It includes three portions: portion 20 for the IC 2, portion 30 for the high side mosfet 3 and portion 40 for the low side mosfet 4. Portion 20 has a plurality of half-etched leads 20.01-20.20 arranged in a 4-by-5 array. Those skilled in the art understand that the twenty leads are representative of the number of leads for an integrated circuit which may have more or less than 20 leads. Each lead is soldered or attached with a conductive adhesive to a terminal of the IC2. Further details of the half-etched configuration of the leads 20.01-20.20 are shown in FIGS. 7a1, 7a2 and 7a3 which are discussed hereinafter. Traces 32, 33 contact, respectively, the gate and source of the high side mosfet 3 and interconnect them to terminals of the integrated circuit 2. Lead 37 provides an external contact, preferably to a power supply line on a printed circuit board. Trace 44 interconnects the source of the low side mosfet 4 to the integrated circuit 2. Trace 47 connects the gate of the low side mosfet 4 to the integrated circuit 2.

High side mosfet leadframe structure portion 30 has a source pad 34 that is half-etched to provide three raised surfaces 34.1-34.3 for contacting the source terminal of mosfet 3 and three external leads 36.1-36.3 for contact an input power source (not shown). The raised surfaces 34.1-34.3 are rectangular in shape and surface 34.1 is slightly larger than the raised surfaces 34.2 and 34.3 for receiving the downset 58 of clip 55. The raised surfaces are provided by half-etching the source pad 34.

Low side mosfet leadframe structure portion 40 has a source pad 43 that is half-etched to provide five raised surfaces 43.1-43.5 for contacting the source of mosfet 4 and external leads 41.1-41.5. Drain bars 42, 46 are also part of the leadframe structure portion 40 and they make mechanical and electrical contact with the conductive clip 50. See FIGS. 7a1-7a3 and 9.

Another embodiment of the invention has a conductive connection on the clips to laterally support a gang of clips and provide stability during clip attachment. See FIG. 9 where conductive connectors 151, 152 extend from the planar portion 56a of clip 55 and conductive connectors 155, 156 extend from top planar portion 52 of clip 50.

Figure 9:
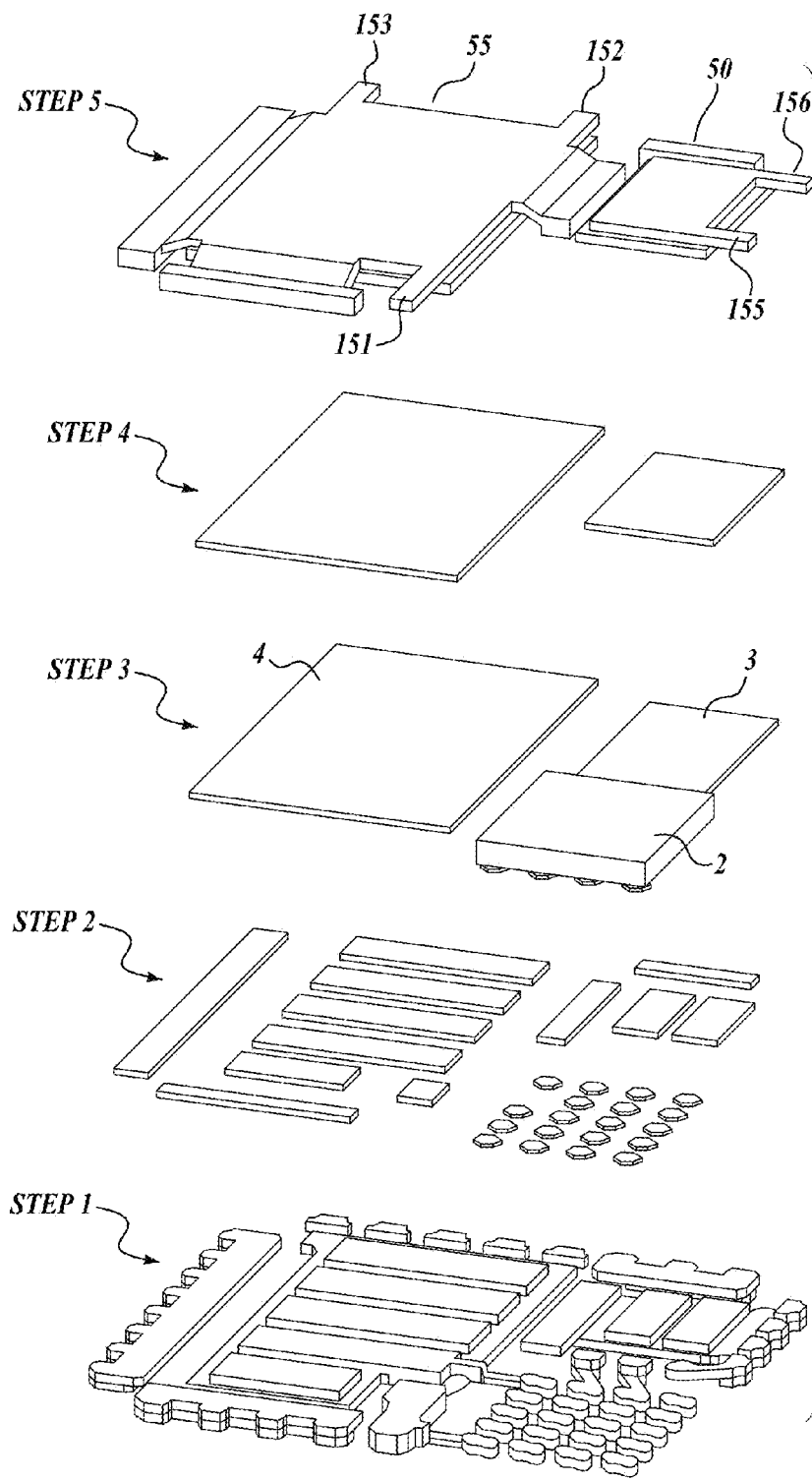
FIG. 9 is a perspective exploded view of components of an embodiment of the invention arranged in the order to their assembly.

Turning to FIG. 9, there is shown an exploded isometric view of the components of one embodiment of the invention in the order in which the components for module 10 or 12 are assembled and molded into a multi-chip package. In Step 1 a strip of suitable metal is punched and/or half-etched to provide the leadframe structure 11 with source pads 34, 43 IC terminals 20.01-20.20 which are all initially connected together at the bottom side for module 12 while only IC terminals 20.01-20.20 are initially connected for module 10. In step 2 solder or conductive adhesive is applied to the top surfaces of the half-etched leads in a pattern corresponding to the surface. In step 3 the IC 2 and the mosfets 3, 4 are attached to the soldered or adhesive surfaces of the leads. In step 4 another layer or solder or conductive adhesive is applied to the upper surfaces of the dies 2, 3 and 4. In step 5 clips with downsets are attached via the solder or the adhesive applied in step 4. In a the next step (not shown) the assembled multi-chip circuit is encapsulated by molding compound 70, then second half-etched at the bottom side to define the terminals. Finally, the non-conductive material or second molding compound is applied to fill in the gaps between terminals.

Embodiments described above solve bond wire problems by eliminating all bond wires among the dies to provide a completely wireless multi-chip module that includes an integrated circuit. Although embodiments are described with respect to a half-bridge circuit, such embodiments are exemplary only and not intended to limit the spirit or scope of the invention which may include multiple integrated circuits, passive devices and additional mosfets, power diodes, and IGBTs. By eliminating the bond wires the claimed invention avoids a number of problems inherent in bond wires such as forming strong metallurgical bonds between bond pads on dies and lead posts and mosfet interconnections. The structures and methods of assembly of the embodiments of the invention are highly efficient and eliminate the need for special wire bonding equipment. The resulting products have improved performance because eliminating the bond wires reduces the inherent inductance of the packaged circuit which will then have lower noise than equivalent circuits made with bond wires. Overall performance is improved due to direct conductive interconnection of integrated circuit bond pads. Using clips with downsets reduces the conventional space requirements of wired bonded devices. In addition, the perimeter of the resulting module is reduced compared to the equivalent perimeter of wire bonded modules. The half-etched leadframe structure interlocks the molding material to improve the overall sealing of the devices in molding compound. Using some double half-etched leadframe structures improves locking and sealing even further. The downsets for the clips stabilize bond line thickness by using the conductive clip downset terminals as standoff control.

While the embodiments disclosed above show both devices flip-chip mounted, persons having ordinary skill in the art know that other configurations are possible. For example, the die attach pads, clips, downsets and traces can be reconfigured to provide two devices regularly mounted with their respective drains on separate die attach pads, a clip with a downset or other means for connecting the high side source to the low side drain, another clip connecting the low side source to external contacts for connection to ground and the die attach pad for the high side source connected to external leads for connection to a suitable power source.

Still other configurations include one mosfet flip-chip mounted and the other mosfet regularly mounted with its drain on the die attach pad. Suitable clips, downsets and external leads interconnect the high side source to the low side drain, connect the source of the low side drain to external terminals connectable to ground and connect the high side drain to external terminals connectable to a power supply.

Embodiments of the invention are fabricated with half-etching and double half-etching techniques for forming copper traces. Those skilled in the art know one or more process techniques for half-etching and double half-etching. In addition, applicant hereby incorporates by reference the entire disclosure of U.S. Application No. 61/834,206 filed Jun. 2, 2013 and assigned to the same assignee as this patent. The incorporated application shows improved techniques for forming pre-molded substrates with upper and lower land. That application discloses a method for manufacturing a pre-molded substrate with routed traces. It relies upon a number of steps beginning with providing a metal substrate having upper and lower surfaces; applying and patterning a first masking layer to expose one or more selected areas of the upper surface corresponding to one or more desired traces; partially etching the exposed surface area to form portions of the desired traces; covering the upper surface of the substrate with a second masking layer to protect the surfaces of the traces; patterning a third masking layer on lower surface of the substrate to expose one or more selected areas corresponding to contact lands; partially etching the exposed surface areas of the lower surface to form the contact lands and simultaneously fully etch the remaining portions of the exposed half-etched lower surface to finish forming the traces; and molding the substrate to fill the half-etched and fully etched areas to hold the traces in position and stiffen the pre-molded substrate.

Figure 10:
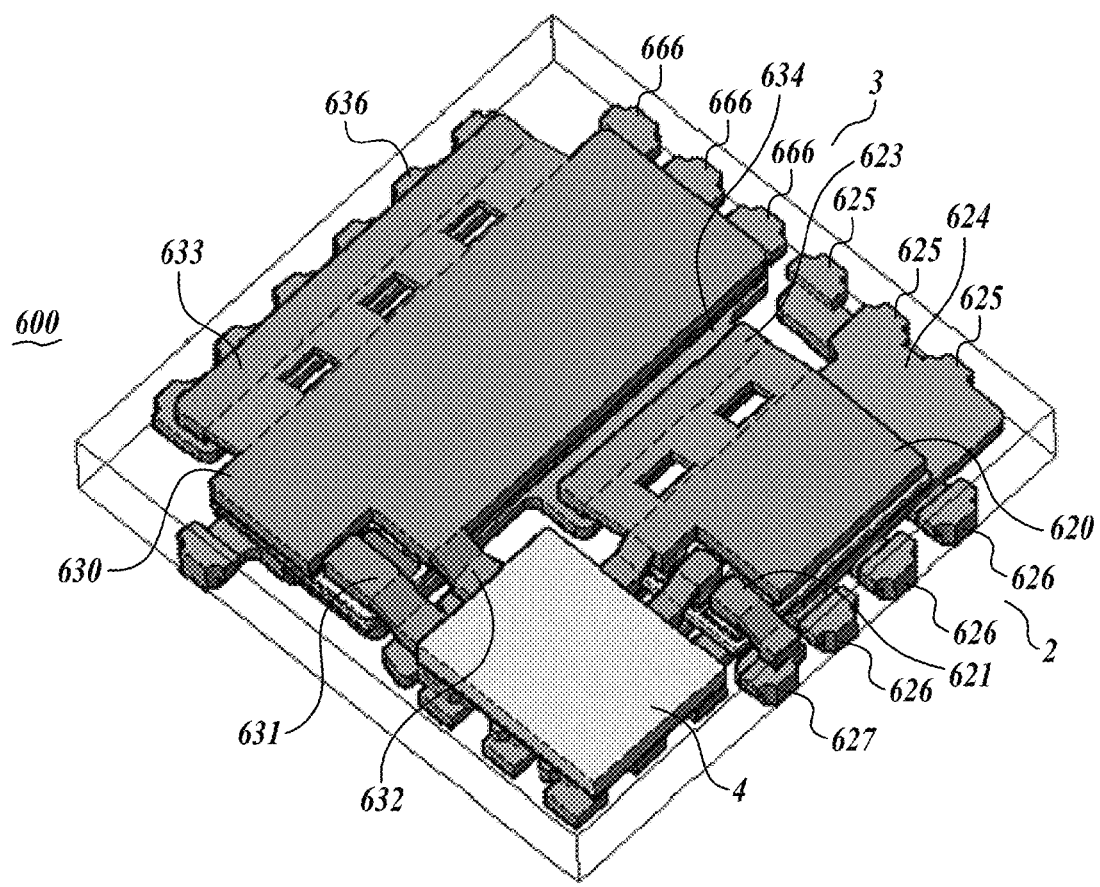
FIG. 10 is an isometric view of an assembled MCM with die attach pads for receiving the drains of the mosfets.

FIGS. 10, 11, 12 and 13a, 13b, show further multichip embodiments using standard die attach mounting. In FIG. 10 the multichip module 600 has integrated circuit 2 mounted on its leads 610.01-610.09. Although nine leads are shown those skilled in the art understand that there may be more or less leads depending upon the complexity of the integrated circuit 2.

The high side mosfet 3 is mounted with its drain attached to a high side die attach pad 624. External high side drain terminals 625 and 626 are soldered or otherwise electrically and mechanically connected to the high side die attach pad 624. A high side source clip 620 has its lower surface electrically and mechanically attached to the source of the high side mosfet 3. Gate clip 621 connects the high side gate to the integrated circuit 2. High side source lead 632 connects the high side source to the integrated circuit 2. Downset 623 is integral with the clip 620 and extends down from the clip 620 to attach to the low side die attach pad 634 which has external switch node terminals 666. Another clip 628 connects the high side source to an external terminal 627.

The low side mosfet 4 has its drain attached to low side die attach pad 634. As mentioned above, external switch node terminals 666 are integral with the low side die attach pad 634. A low side source clip 630 has its lower surface electrically and mechanically attached to the source of the low side mosfet 4. Lead 632 extends from the low source clip to a terminal of the integrated circuit 2. Gate clip 631 connects the high side gate to the integrated circuit 2. Downset 633 is integral with the clip 630 and extends down from the clip 630 to attach to low side source external terminals 636.

Figure 11:
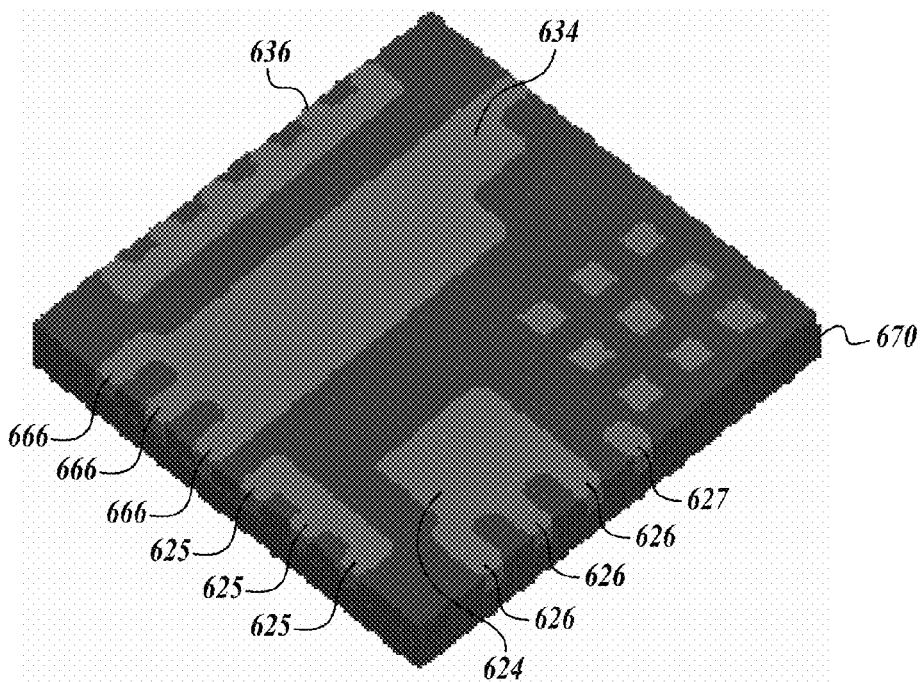
FIG. 11 is a bottom isometric view of the MCM of FIG. 10 with one molding compound.
Figure 12:
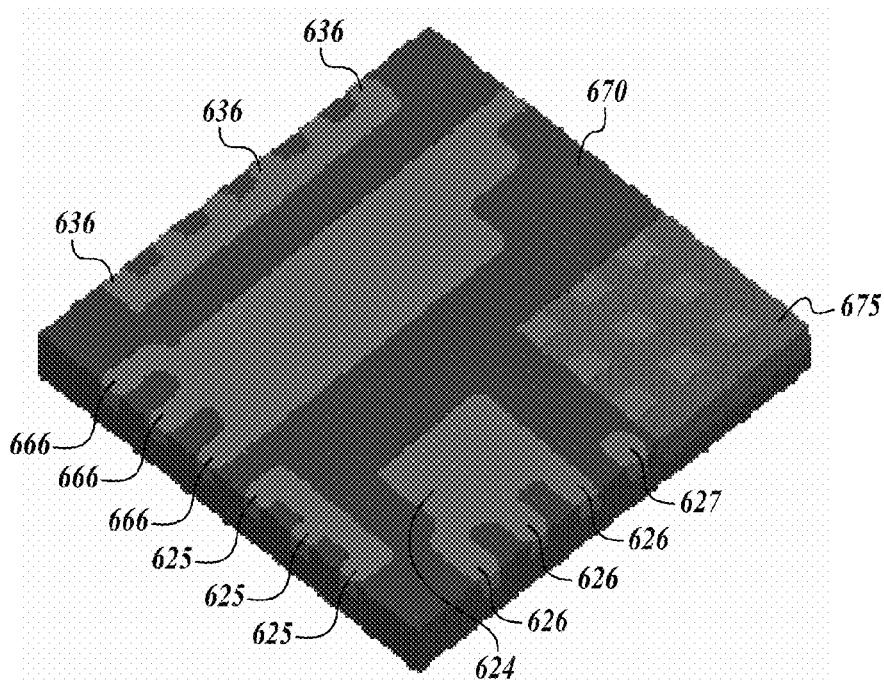
FIG. 12 is a bottom isometric view of the MCM of FIG. 10 with the integrated circuit terminals embedded in a non-conductive material and the rest of the MCM encapsulated in a molding compound.
Figure 13A:
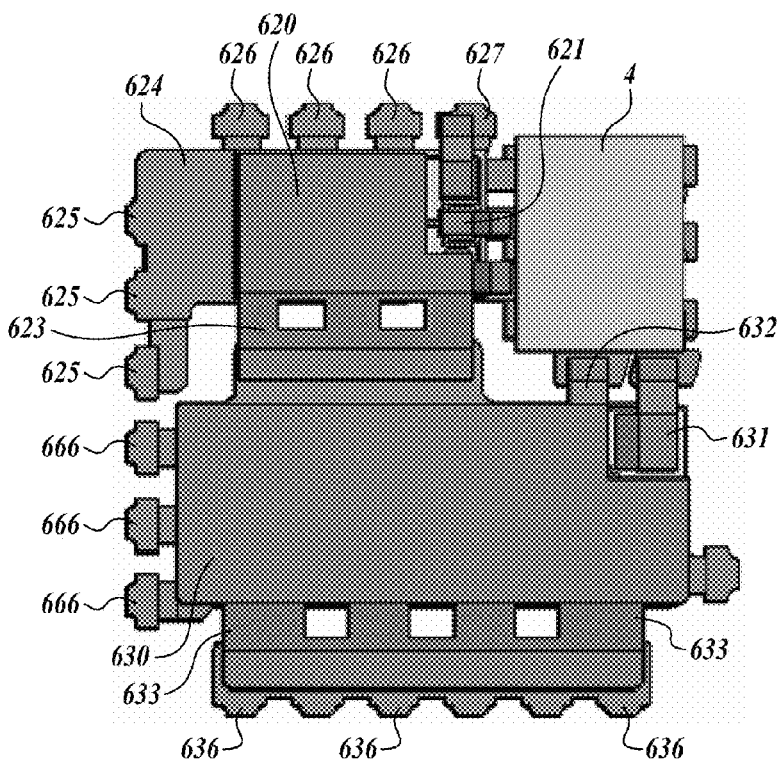
FIG. 13a is top view of the assembled MCM of FIG. 10 without molding compound.
Figure 13B:
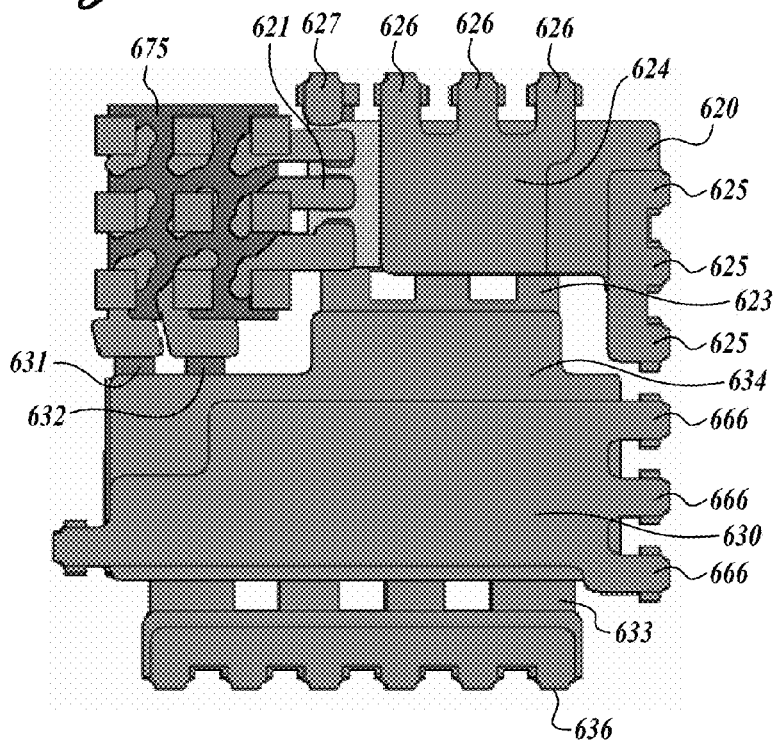
FIG. 13b is a bottom view of the assembled MCM of FIG. 10 with non-conductive material embedding the terminals of the integrated circuit.

In the embodiment shown in FIG. 11, all components are encapsulated in molding compound 670. In the embodiment shown in FIG. 12, the terminals of the integrated circuit are molded in a non-conductive compound 675 and later further encapsulated in a molding compound 670 which protects the mosfets 3, 4.

While illustrative embodiments have been illustrated and described, it will be appreciated that various changes can be made therein without departing from the spirit and scope of the invention.

The invention claimed is:

1. A wireless multichip module comprising:
    a plurality of active components including an integrated circuit having a plurality of terminals and one or more semiconductor devices including a first semiconductor device having two or more terminals;
    a leadframe structure for supporting and interconnecting the integrated circuit and the one or more semiconductor devices, said leadframe structure having:
        one or more semiconductor leadframe structure portions including a first semiconductor leadframe structure portion having one or more pads, said pads mechanically and electrically attached to separate terminals of the first semiconductor device,
an integrated circuit leadframe structure portion having a plurality of leads for connecting to an integrated circuit, and
one or more traces, including a first trace that is included in the first semiconductor leadframe structure portion, the first trace extending from the first semiconductor leadframe structure portion to the integrated circuit leadframe structure portion and electrically connecting a pad of the one or more pads of the first semiconductor leadframe structure portion to a lead of the integrated circuit leadframe structure portion;
a clip coupled to another terminal of the semiconductor device for connecting said another terminal of the semiconductor device to a terminal of another semiconductor device,
said integrated circuit having a plurality of terminals including a first terminal, said integrated circuit being flip-chip mounted onto said plurality of leads for connecting the terminals of the integrated circuit to the leads including connecting said first terminal of the integrated circuit to said first trace which is also connected to a pad of the semiconductor leadframe structure portion,
the integrated circuit being wirelessly connected to the one or more semiconductor devices via at least the first trace of the one or more traces; and
an insulating molding compound encapsulating the leadframe structure, the one or more semiconductor devices and the integrated circuit into a module.

2. The wireless module of claim 1, wherein the leadframe structure is half-etched to provide leads and pads having perimeters with profiles having at least one step for locking the insulating molding compound to the leadframe structure.

3. The wireless module of claim 2, wherein portions of the leadframe structure are double half-etched to provide leads and pads having perimeters with profiles having two or more steps for locking the insulating molding compound to the leadframe structure.

4. The wireless module of claim 1, wherein the clip is made of conductive material and has a planar surface for connecting to a surface of another semiconductor die and has a downset portion extending down from the planar surface for connecting to a pad of a semiconductor leadframe structure portion.

5. The wireless module of claim 1, wherein the one or more semiconductor devices includes at least one metal-oxide-semiconductor field-effect transistor (MOSFET).

6. The wireless module of claim 1, wherein the semiconductor leadframe structure portions include two pads and the semiconductor device has two or more terminals on one side, a single terminal on another side and is flip-chip mounted on said pads so that each terminal on the one side of the semiconductor device is attached to different pads.

7. The wireless module of claim 6, wherein the semiconductor device is mounted with its single terminal on one pad.

8. The wireless module of claim 1, wherein the insulating molding compound is a first molding compound, the leads of the integrated circuit portion, or the leads and pads of the wireless module are finally separated by an etch performed after assembly encapsulation, and gaps between terminals are filled with a second molding compound or other non-conductive material.

9. The wireless module of claim 1, wherein the one or more semiconductor devices includes a high-side metal-oxide-semiconductor field-effect transistor (MOSFET) and a low side (MOSFET) that are connected to the integrated circuit to form a half-bridge circuit.

10. The wireless module of claim 1, wherein the one or more semiconductor devices includes at least one of a power device, a diode, a metal-oxide-semiconductor field-effect transistor (MOSFET), or an insulated-gate bipolar transistor (IGBT).

11. A wireless multichip module comprising:
a plurality of active components including an integrated circuit, a first metal-oxide-semiconductor field-effect transistor (MOSFET) and a second MOSFET;
a leadframe structure for supporting and interconnecting the integrated circuit, first MOSFET and the second MOSFET, said leadframe structure having:
a first MOSFET leadframe structure portion with a first MOSFET source pad and a first MOSFET gate pad,
a second MOSFET leadframe structure portion with a second MOSFET source pad and a second MOSFET gate pad,
an integrated circuit leadframe structure portion having a plurality of leads for connecting to an integrated circuit including a first gate lead and a second gate lead, the first gate lead and the second gate lead each including an upper element having a first shape and a lower element having a second shape that is different than the first shape; and
a plurality of traces, including a first trace connecting the first gate pad to a first gate lead of the integrated circuit leadframe structure portion and a second trace connecting the second gate pad to a second gate lead of the integrated circuit leadframe structure portion;
a clip coupled to a source of the first MOSFET and to a drain of the second MOSFET,
said integrated circuit having a plurality of terminals including a first gate control terminal and a second gate control terminal, said integrated circuit being flip-chip mounted onto said plurality of leads for connecting the first gate control terminal to the first gate lead and connecting the second gate control terminal to the second gate lead,
the first MOSFET having a source terminal, a gate terminal and a drain terminal and being flip chip mounted to connect the source terminal of the first MOSFET to the first MOSFET source pad and connect the gate terminal of the first MOSFET to the first MOSFET gate pad,
the second MOSFET having a source terminal, a gate terminal and a drain terminal and being flip chip mounted to connect the source terminal of the second MOSFET to the second MOSFET source pad and connect the gate terminal of the second MOSFET to the second MOSFET gate pad,
the integrated circuit being wirelessly connected, respectively, to the first MOSFET and the second MOSFET via, at least the first trace and the second trace; and
an insulating molding compound encapsulating the leadframe structure, the first MOSFET, the second MOSFET and the integrated circuit into a module.

12. The wireless module of claim 11, wherein the leadframe structure is half-etched to provide leads and pads having perimeters with profiles having at least one step for locking the insulating molding compound to the leadframe structure.

13. The wireless module of claim 12, wherein portions of the leadframe structure are double half-etched to provide leads and pads having perimeters with profiles having two or more steps for locking the insulating molding compound to the leadframe structure.

14. The wireless module of claim 11, wherein the clip is made of a conductive material, has a planar surface for connecting to a surface of another semiconductor die and has a downset portion extending down from the planar surface for connecting to a pad of a semiconductor leadframe structure portion.

15. The wireless module of claim 11, wherein the first MOSFET leadframe structure portion includes a source pad and a gate pad, the first MOSFET being flip-chip mounted to the first MOSFET leadframe structure portion to connect the source terminal of the first MOSFET to the source pad and the gate terminal of the first MOSFET to the gate pad.

16. The wireless module of claim 11, wherein the first MOSFET leadframe structure portion includes a drain pad.

17. The wireless module of claim 11, wherein the leads of the integrated circuit leadframe structure portion are pre-molded in a non-conductive material.

18. The wireless module of claim 11, wherein the first MOSFET and the second MOSFET are coupled with the integrated circuit to form a half-bridge circuit.

19. The wireless module of claim 11, further comprising at least one of a power device, a diode or an insulated-gate bipolar transistor.

20. The wireless multichip module of claim 1, wherein the first trace directly electrically connects the pad of the one or more pads of the first semiconductor leadframe structure portion to the lead of the integrated circuit leadframe structure portion.

* * * * *